US007696607B2

(12) United States Patent
Sano et al.

(10) Patent No.: US 7,696,607 B2
(45) Date of Patent: Apr. 13, 2010

(54) SEMICONDUCTOR DEVICE

(75) Inventors: Hikari Sano, Hyogo (JP); Masao Takahashi, Kyoto (JP); Hiroshige Hirano, Nara (JP); Koji Takemura, Osaka (JP)

(73) Assignee: Panasonic Corporation, Osaka (JP)

( * ) Notice: Subject to any disclaimer, the term of this patent is extended or adjusted under 35 U.S.C. 154(b) by 70 days.

(21) Appl. No.: 11/889,210

(22) Filed: Aug. 9, 2007

(65) Prior Publication Data

US 2008/0036042 A1 Feb. 14, 2008

(30) Foreign Application Priority Data

Aug. 10, 2006 (JP) ............................. 2006-218904

(51) Int. Cl.
*H01L 23/544* (2006.01)
(52) U.S. Cl. ........................... 257/620; 438/462
(58) Field of Classification Search ................ 257/620, 257/758, E23.178, E23.179, E21.525; 438/462
See application file for complete search history.

(56) References Cited

U.S. PATENT DOCUMENTS 6,521,975 B1 * 2/2003 West et al. ................... 257/620
6,563,148 B2 * 5/2003 Kawashima et al. ......... 257/202
2005/0212136 A1 * 9/2005 Karasawa et al. ........... 257/758
2005/0269702 A1 * 12/2005 Otsuka ....................... 257/750
2006/0076651 A1 * 4/2006 Tsutsue ...................... 257/620

FOREIGN PATENT DOCUMENTS

| JP | 2004-153015 | 5/2004 |
| JP | 2004-235357 | 8/2004 |
| JP | 2006-041244 | 2/2006 |

* cited by examiner

*Primary Examiner*—Steven Loke
*Assistant Examiner*—Kimberly M Thomas
(74) *Attorney, Agent, or Firm*—McDermott Will & Emery LLP

(57) ABSTRACT

A semiconductor device includes: a circuit region having a function element formed on a semiconductor substrate; a scribe region located between the circuit region and another circuit region formed spaced from the circuit region, the scribe region including a cutting region and non-cutting regions provided at both sides of the cutting region; a first interlayer insulating film formed in the scribe region on the semiconductor substrate; a first dummy pattern made of conductive material and formed in the first interlayer insulating film in the cutting region; and a second dummy pattern made of conductive material and formed in the first interlayer insulating film in each of the non-cutting regions. The ratio, per unit area, of the area of the first dummy pattern to the area of the cutting region is lower than the ratio, per unit area, of the area of the second dummy pattern to the area of the non-cutting regions.

19 Claims, 18 Drawing Sheets

SEMICONDUCTOR DEVICE

CROSS-REFERENCE TO RELATED APPLICATION

The disclosure of Japanese Patent Application No. 2006-218904 filed on Aug. 10, 2006 including specification, drawings and claims is incorporated herein by reference in its entirety.

BACKGROUND OF THE INVENTION

The present invention relates to a semiconductor device having a multilevel interconnection structure.

Interconnect layers in a semiconductor device having a multilevel interconnection structure are generally formed by using a method (a damascene process) in which a trench formed in an interlayer insulating film for each interconnect layer is filled with a metal film. The metal film deposited over the entire surface of the semiconductor substrate is subjected, for example, to a chemical mechanical polishing (CMP) process for removal of unnecessary part thereof, such that the metal film is left only in the trench. In this polishing process, in an area where the wiring pattern formed in the interlayer insulating film is sparse, the film thickness of the wiring pattern becomes smaller as compared with an area in which the wiring pattern is dense, because the polishing speed varies. To prevent such film thickness variation, a method is adopted in which a pseudo wiring pattern is provided as a dummy pattern in the area where the wiring pattern is sparse. The dummy wiring pattern thus provided prevents pattern dishing occurring in the CMP process.

For example, Japanese Laid-Open Publication No. 2004-235357 describes semiconductor devices in which a uniform dummy pattern is provided in a scribe region and in circuit regions on the semiconductor substrate for prevention of dishing in CMP process.

FIG. 10(a) shows the planar structure of a scribe region, a region which is cut when a semiconductor wafer having conventional semiconductor devices is divided into chips. FIG. 10(b) shows the structure in cross section taken along the line Xb-Xb in FIG. 10(a).

As shown in FIGS. 10(a) and 10(b), a plurality of circuit regions 2, in which function elements (not shown) are formed, are provided spaced from each other on the principal surface of a semiconductor substrate 1, and seal rings 3 made of conductive material are formed to surround the circuit regions 2. And a scribe region 4, a region which is cut to obtain the individual circuit regions 2, is formed between the circuit regions 2.

On the principal surface of the semiconductor substrate 1, first interlayer insulating films 11 and second interlayer insulating films 12 are stacked alternately. In the circuit regions 2, interconnects (not shown) made of conductive material are formed in the first interlayer insulating films 11, while vias (not shown) made of conductive material are formed in the second interlayer insulating films 12. On the other hand, in the scribe region 4, a dummy pattern 107, which is a uniformly spaced isolated pattern (an island-shaped pattern) made of conductive material, is formed in the first interlayer insulating films 11. In this way, the dummy pattern 107 is provided at uniform intervals in the scribe region 4 on the semiconductor substrate 1 so as to prevent dishing in CMP process.

However, when the scribe region 4 of the conventional semiconductor devices is cut by a dicing blade, the dicing blade cuts the conductive material of the dummy pattern 107. The cutting part of the dicing blade thus becomes clogged with the conductive material to cause the cutting ability of the dicing blade to degrade, leading to a problem in that chipping is likely to occur in the resultant semiconductor chips.

Nevertheless, if the dummy pattern 107 is not provided in the scribe region 4, the aforesaid problem, i.e., the occurrence of dishing in the CMP process, arises.

SUMMARY OF THE INVENTION

It is therefore an object of the present invention to solve the above problem and prevent dishing in CMP process, while reducing clogging of a dicing blade when a semiconductor substrate (wafer) is diced, for prevention of chipping defects.

In order to achieve the object, according to the invention, a semiconductor device has a structure in which in a scribe region, a dummy pattern's occupancy ratio in a cutting region is smaller than a dummy pattern's occupancy ratio in non-cuttings regions located at both sides of the cutting region, and regions having a further smaller occupancy ratio are provided in parts of the cutting region located close to the non-cutting regions, or regions having a further smaller occupancy ratio are provided in parts of the non-cutting regions located close to circuit regions.

Specifically, an inventive semiconductor device includes: a circuit region having a function element formed on a semiconductor substrate; a scribe region located between the circuit region and another circuit region formed spaced from the circuit region, the scribe region including a cutting region and non-cutting regions provided at both sides of the cutting region; a first interlayer insulating film formed in the scribe region on the semiconductor substrate; a first dummy pattern made of conductive material and formed in the first interlayer insulating film in the cutting region; and a second dummy pattern made of conductive material and formed in the first interlayer insulating film in each of the non-cutting regions, wherein the ratio, per unit area, of the area of the first dummy pattern to the area of the cutting region is lower than the ratio, per unit area, of the area of the second dummy pattern to the area of the non-cutting regions.

In the inventive semiconductor device, the degree of uniformity in the multilayer structure composed of the interlayer insulating films in the cutting and non-cutting regions is reduced, such that in the scribe region the mechanical strength of the cutting region is lower than that of the non-cutting regions. This prevents damage occurring in the cutting region during the dicing process using a dicing blade from reaching the non-cutting regions. Furthermore, since the first dummy pattern's occupancy ratio is lower than the second dummy pattern's occupancy ratio, the amount of the conductive material of the first dummy pattern that is cut with the dicing blade is reduced. As a result, the dicing blade is not likely to become clogged, preventing occurrence of clogging-caused cracks growing toward the substrate. On the other hand, the presence of the second dummy pattern having a higher occupancy ratio (density) than the first dummy pattern allows the mechanical strength of the non-cutting regions to be increased as compared with the cutting region. Thus, in the non-cutting regions, occurrence of damage due to stress produced in the non-cutting regions during the dicing process is reduced. Moreover, since clogging of the lateral sides of the dicing blade is prevented, the cutting ability is restorable by polishing the end faces of the blade, thereby permitting the dicing blade to have a longer life.

In the inventive device, the cutting region preferably has a width equal to or greater than the edge width of a dicing blade used to cut the scribe region.

Then, it is possible to reliably suppress clogging of the dicing blade.

The inventive device preferably further includes a seal ring made of conductive material and formed on the semiconductor substrate so as to surround the periphery of the circuit region.

In the inventive device, the scribe region is preferably formed surrounding the circuit region and preferably serves as a region which is cut when the circuit region is cut from the semiconductor substrate.

In the inventive device, the pitch of the first dummy pattern is preferably greater than that of the second dummy pattern.

Then, it is possible to reliably suppress clogging of the lateral sides of the dicing blade.

In the inventive device, the size of the first dummy pattern is preferably smaller than that of the second dummy pattern.

In this way, it is also possible to reliably suppress clogging of the lateral sides of the dicing blade.

In the inventive device, the average ratio, per unit area, of the area of the first dummy pattern to the area of the cutting region is preferably equal to or higher than 10% and lower than 25%; and the average ratio, per unit area, of the area of the second dummy pattern to the area of the non-cutting regions is preferably equal to or higher than 25% and equal to or lower than 90%.

In the inventive device, regions in the cutting region which are brought into contact with the lateral sides of a dicing blade are preferably first spaces in which the first dummy pattern is not formed.

Then, in the dicing process, at least the lateral sides of the dicing blade are not brought into contact with the conductive material, thereby preventing the lateral sides of the dicing blade from being clogged. As a result, occurrence of cracks growing toward the substrate is prevented more effectively.

In the inventive device, the first spaces preferably have a width equal to or greater than the distance of a minimum pitch of the first dummy pattern.

Then, it is possible to reliably prevent clogging of the lateral sides of the dicing blade.

In the inventive device, the cutting region preferably includes a region which is brought into contact with at least the lateral sides of a dicing blade, and has first regions, which are adjacent to the non-cutting regions, and a second region, which is a region in the cutting region other than the first regions; and the ratio, per unit area, of the area of part of the first dummy pattern located in the first regions to the area of the first regions is preferably lower than the ratio, per unit area, of the area of part of the first dummy pattern located in the second region to the area of the second region.

Moreover, in the inventive device, the cutting region preferably includes a region which is brought into contact with at least the lateral sides of a dicing blade, and has first regions, which are adjacent to the non-cutting regions, and a second region, which is a region in the cutting region other than the first regions; and the first dummy pattern is preferably not formed in the first regions, and the first dummy pattern is preferably formed only in the second region.

Then, it is possible to reliably prevent clogging of the lateral sides of the dicing blade.

In this case, the second region in the cutting region preferably has a width smaller than the edge width of the dicing blade and is preferably located inwardly of the lateral sides of the dicing blade.

In the inventive device, the non-cutting regions preferably include third regions adjacent to the circuit region, and fourth regions adjacent to the cutting region; and the third regions are preferably second spaces in which the second dummy pattern is not formed, and the second dummy pattern is preferably formed only in the fourth regions.

Then, it is possible to prevent the non-cutting regions and the circuit region from having the structural uniformity. Furthermore, since the second spaces having low structural strength are provided in the non-cutting regions, even if a crack growing toward the substrate occurs, damage due to the crack is allowed to escape into the second spaces whose strength is lower than the other regions, thereby preventing the crack from reaching the circuit region.

In this case, the second spaces preferably have a width equal to or greater than the distance of a minimum pitch of the second dummy pattern.

Also, in the inventive device, a third space in which the first dummy pattern is not formed is preferably provided in a central part of the cutting region in a direction in which the cutting region is cut.

Then, the third space prevents clogging of the central part of the edge side of the dicing blade and also allows cracks occurring in the semiconductor substrate to grow in the depth direction more easily, thereby preventing transverse stress and crack propagation in the semiconductor substrate.

In the inventive device, the first interlayer insulating film is preferably also formed in the circuit region on the semiconductor substrate; and in the first interlayer insulating film, an interconnect, which is electrically connected with the function element, is preferably formed.

In this case, the inventive device preferably further includes a second interlayer insulating film formed on the upper or lower side of the first interlayer insulating film; and a via formed in the second interlayer insulating film and electrically connected with the interconnect.

As described above, in the semiconductor devices according to the invention, dishing occurring in CMP process is prevented, and cracking in the semiconductor substrate is suppressed by reducing clogging of the dicing blade when the semiconductor substrate (wafer) is diced. In addition, the circuit regions are protected from damage caused during the dicing process, while chipping is also prevented. Thus, the highly reliable semiconductor devices are realized.

BRIEF DESCRIPTION OF THE DRAWINGS

FIG. 10($b$) is a cross-sectional view taken along the line Xb-Xb in FIG. 10($a$).

DETAILED DESCRIPTION OF THE INVENTION

Embodiment

Figure 1:
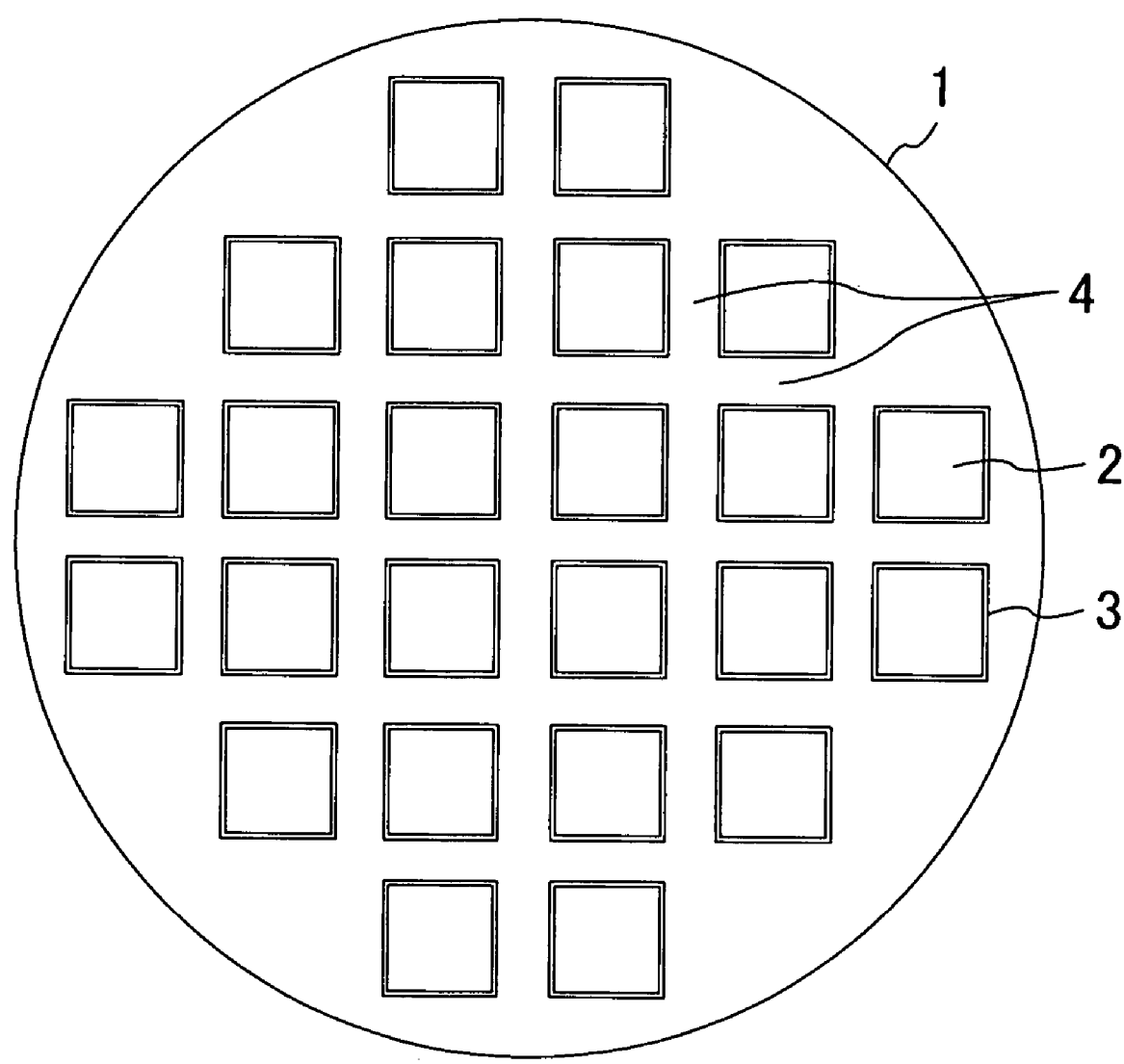
FIG. 1 is a plan view showing wafer-level semiconductor devices according to an embodiment of the invention.

Hereinafter, an embodiment of the present invention will be described with reference to the accompanying drawings. FIG. 1 shows the planar structure of semiconductor devices according to the first embodiment.

As shown in FIG. 1, the semiconductor devices according to this embodiment are formed at intervals in a matrix on a wafer-like semiconductor substrate 1 as circuit regions 2 which have function elements (not shown) electrically connected by interconnects and vias coupled to the interconnects.

The circuit regions 2 are surrounded by loop-like seal rings 3 including line vias in a single row or in two or more rows. The line vias herein mean linear vias connected along linear interconnects formed in first interlayer insulating films, for example.

A scribe region 4 is formed on the semiconductor substrate 1 between the circuit regions 2 surrounded by the seal rings 3, as a region which is cut in a dicing process in which the semiconductor devices, i.e., the circuit regions 2, are cut from the semiconductor substrate 1.

In the circuit regions 2, a wiring pattern (not shown), composed of interconnects and vias, and a dummy pattern (not shown), composed of dummy interconnects and dummy vias made of the same conductive material as the wiring pattern, are formed. In the scribe region 4, dummy patterns (not shown), composed of dummy interconnects and dummy vias made of the same conductive material as the wiring pattern, are formed. By providing the dummy patterns in the circuit regions 2 and in the scribe region 4 in this way, it is possible to prevent dishing occurring in CMP process.

Figure 2A:
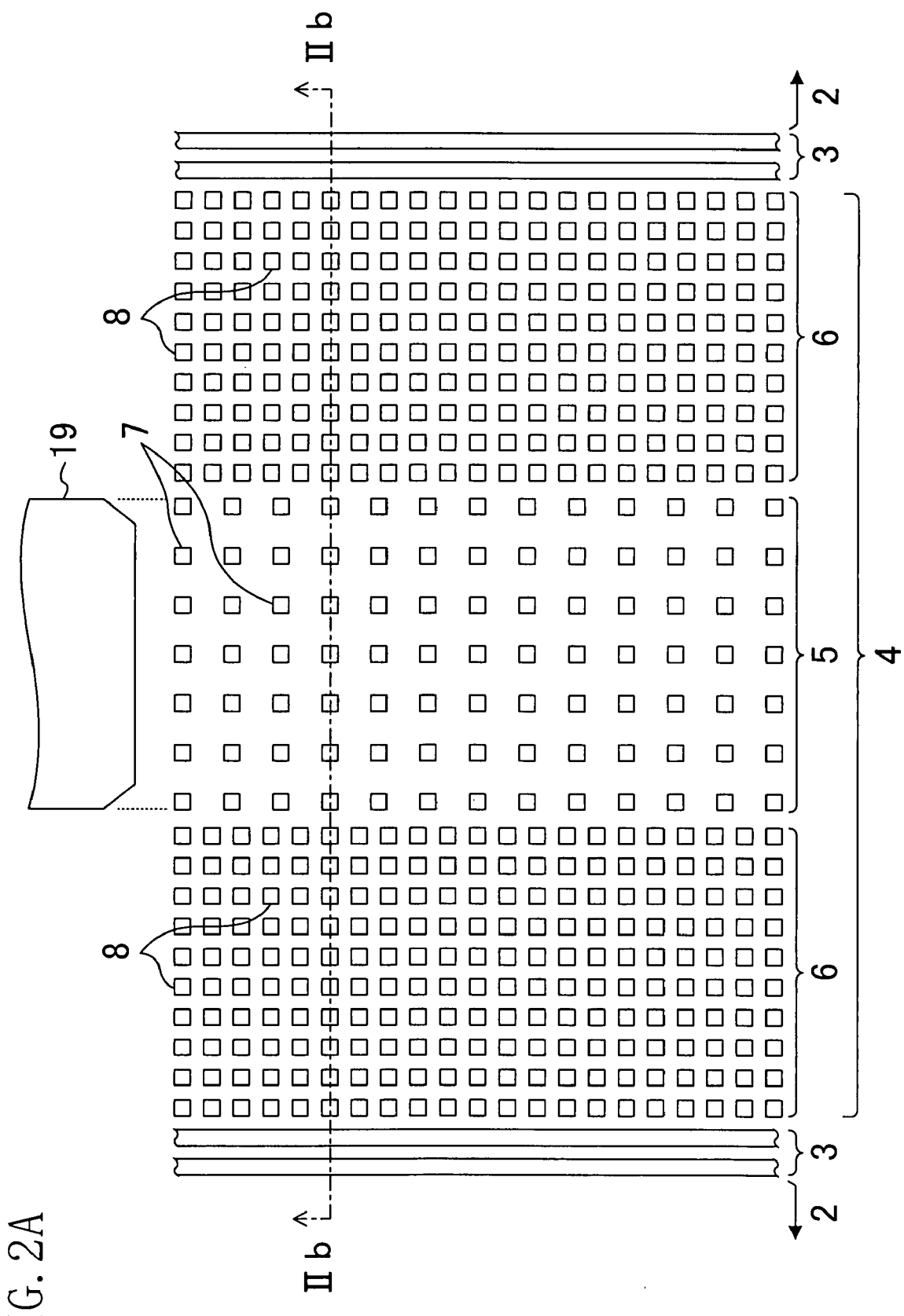
FIG. 2A is an enlarged partial plan view showing a scribe region in a semiconductor device according to the embodiment of the invention.
Figure 2B:
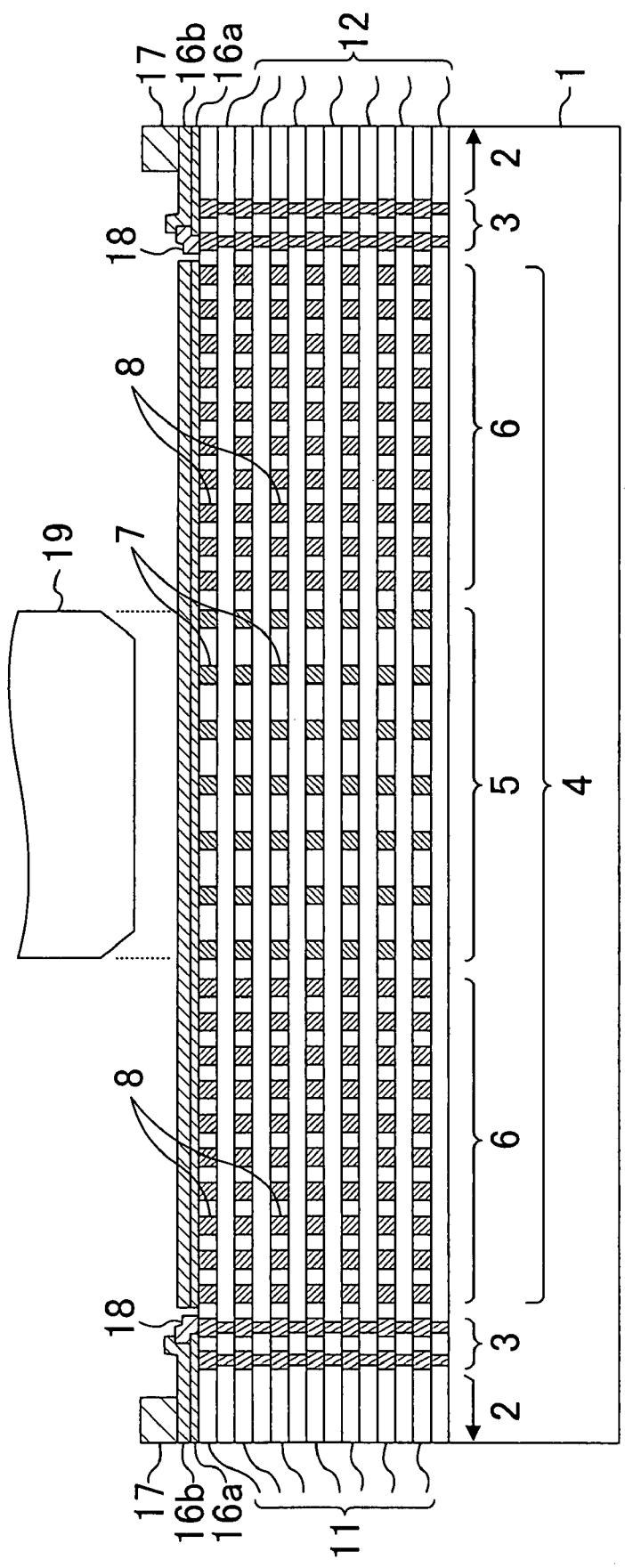
FIG. 2B is a cross-sectional view taken along the line IIb-IIb in FIG. 2A.

FIG. 2A is a partial enlarged view showing the end portions of circuit regions 2 shown in FIG. 1 and the scribe region 4 between the circuit regions 2. FIG. 2B shows the structure in cross section taken along the line IIb-IIb in FIG. 2A. FIG. 2A shows the upper face of one of the first interlayer insulating films.

As shown in FIG. 2A, the scribe region 4 is divided into a cutting region 5 and non-cutting regions 6. The cutting region 5 is the central part of the scribe region 4 and is cut with a dicing blade 19 in a dicing process. The non-cutting regions 6 are located at both sides of the cutting region 5 and are not cut. In the cutting region 5, a first dummy pattern 7 is formed, while in the non-cutting regions 6, a second dummy pattern 8 is formed. The cutting region 5 in the scribe region 4 has a region that is brought into contact with at least the edge of the dicing blade 19, and has a width equal to or greater than the edge width of the dicing blade 19.

As shown in the cross-sectional view in FIG. 2B, the semiconductor device according to this embodiment has a multi-layer structure, which is formed on the upper face of the semiconductor substrate 1 and in which first interlayer insulating films 11, containing interconnects and dummy interconnects, and second interlayer insulating films 12, containing vias and dummy vias, are alternately stacked. In this embodiment, in the first interlayer insulating films 11, the first dummy pattern 7 is formed in the cutting region 5, and the second dummy pattern 8 is formed in the non-cutting regions 6. On the other hand, in the second interlayer insulating films 12, no dummy patterns are formed in the cutting region 5 and in the non-cutting regions 6. It should be noted that an etching stopper film, a cap film or the like may be formed between the first and second interlayer insulating films 11 and 12. Illustration of function elements, e.g., doped layers, gate electrodes, etc. of transistors, formed in the upper part in, or on the principal surface of, the semiconductor substrate 1 is omitted.

In the circuit regions 2 and in the scribe region 4, a first protective film 16a and a second protective film 16b, each made of insulating material, are stacked in this order on the uppermost layer of the first interlayer insulating films 11 with a spacing between the stack of the protective films 16a and 16b formed in each circuit region 2 and the stack formed in the scribe region 4. On the second protective film 16b in each circuit region 2, a resin protective film 17 made of insulating material is formed. Also, a buried film 18 made of conductive material is provided at the end portion of each first protective film 16a located close to the scribe region 4.

In this embodiment, the ratio, per unit area, of the area occupied by the first dummy pattern 7 to the area of the cutting region 5 is set lower than the ratio, per unit area, of the area occupied by the second dummy pattern 8 to the area of the non-cutting regions 6. As theses per-unit-area occupancy ratios, average occupancy ratios, each of which is the average value of data obtained by measuring a plurality of measurement areas, may be used.

As described above, in each semiconductor device formed on the wafer-like semiconductor substrate 1 according to this embodiment, the per-unit-area occupancy ratio of the first dummy pattern 7 provided in the region in the scribe region 4 including at least the cutting region 5 is set lower than that of the second dummy pattern 8 provided in the non-cutting regions 6 located at both sides of the region including the cutting region 5. As a result, in the scribe region 4, the structural uniformity in the cutting region 5 and the non-cutting regions 6 is broken, which allows distribution of strength to occur in the scribe region 4. To be specific, the strength of the non-cutting regions 6 is higher than that of the cutting region 5. Thus, damage occurring in the cutting region 5 in the dicing process is not likely to affect the non-cutting regions 6.

In other words, in the semiconductor device of this embodiment, the first dummy pattern 7 in the cutting region 5 is provided at a lower density than the second dummy pattern 8 provided in the non-cutting regions 6. For example, the pattern pitch of the first dummy pattern 7 may be made greater than that of the second dummy pattern 8, or the pattern size of the first dummy pattern 7 may be made smaller than that of the second dummy pattern 8. In this way, the amount, per unit area, of the conductive material of the first dummy pattern 7 is made smaller than that of the conductive material of the second dummy pattern 8, whereby clogging of the dicing blade 19 in the dicing process is reduced. It is thus possible to prevent occurrence of cracks growing toward the semiconductor substrate 1 caused by clogging of the dicing blade 19 (hereinafter referred to simply as "substrate cracking").

On the other hand, the non-cutting regions 6 in the scribe region 4, in which the second dummy pattern 8 is provided densely, have a structure having higher strength than the structure of the cutting region 5 where the first dummy pattern 7 is provided sparsely. This reduces occurrence of damage caused by stress produced in the non-cutting regions 6 during the dicing process.

For more effective prevention of clogging of the dicing blade 19, it is desirable that the first dummy pattern 7 in the cutting region 5 be provided as sparsely as possible so long as the uniformity of the film thickness is maintained in the CMP process. To that end, the average ratio, per unit area, of the area occupied by the first dummy pattern 7 to the area of the cutting region 5 is preferably equal to or higher than 10% but lower than 25%. On the other hand, to reduce occurrence of damage caused by stress produced in the non-cutting regions 6, it is desirable that the second dummy pattern 8 be provided as densely as possible. For that purpose, it is preferable that the average ratio, per unit area, of the area occupied by the second dummy pattern 8 to the area of the non-cutting regions 6 be approximately equal to or higher than 25% but not more than 90%. It should be noted that the average ratio, per unit area, of the area occupied by the first dummy pattern 7 to the area of the cutting region 5 is not limited to the range described above. It is sufficient if the average ratio, per unit area, of the area occupied by the first dummy pattern 7 to the area of the cutting region 5 is lower than the average ratio, per unit area, of the area occupied by the second dummy pattern 8 to the area of the non-cutting regions 6, and dishing occurring in the CPM process is prevented. Therefore, the average ratio, per unit area, of the area occupied by the first dummy pattern 7 to the area of the cutting region 5 may be equal to or higher than 5% and lower than 50%, for example.

Figure 3:
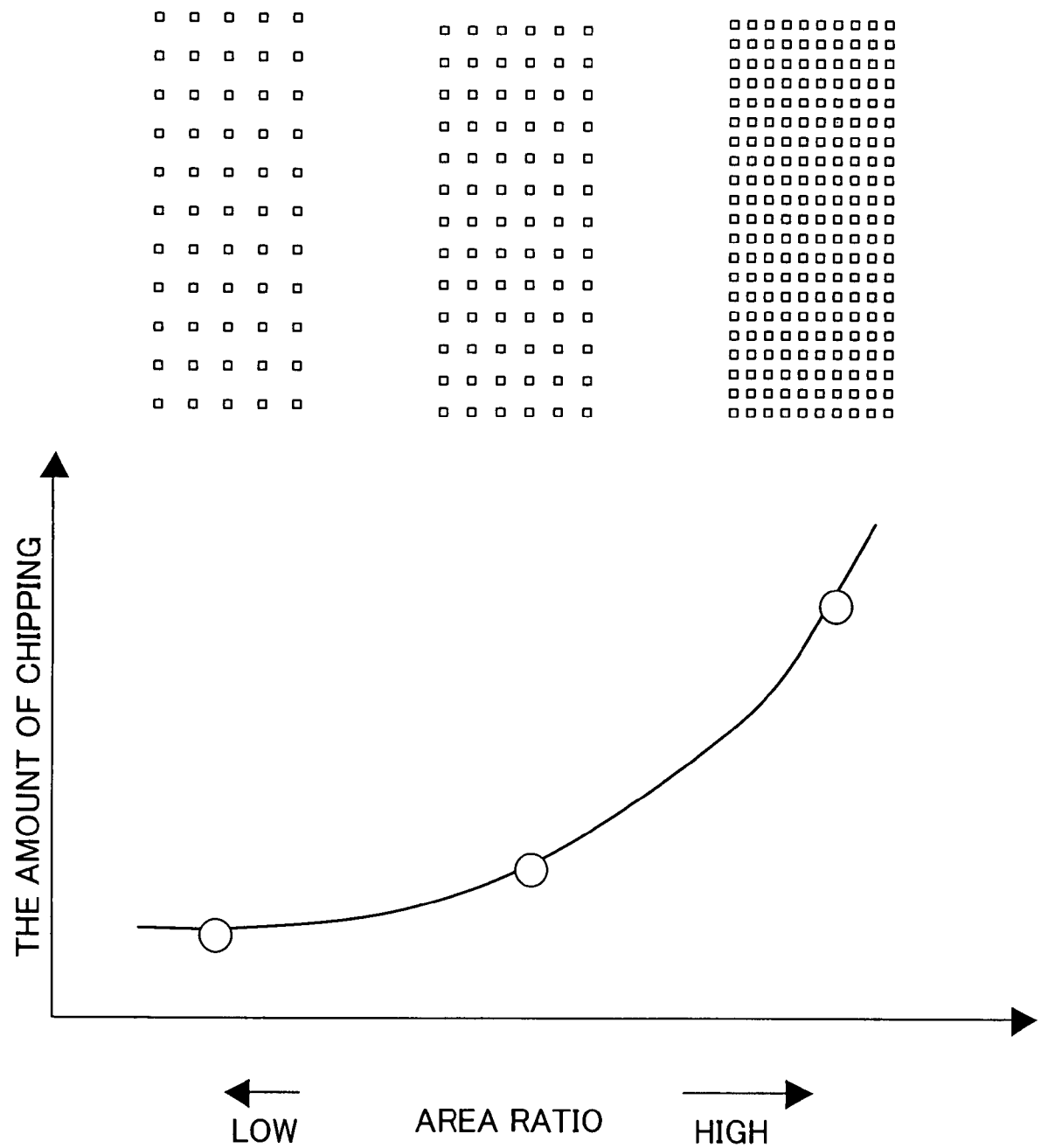
FIG. 3 is a graph showing relationship between the area ratio of a first dummy pattern and the amount of chipping in the semiconductor device of the embodiment of the invention.

FIG. 3 shows relationship between the dummy density (the area ratio) of the first dummy pattern 7 according to this embodiment and the amount of chipping. In FIG. 3, the abscissa represents the area ratio of the pattern, while the ordinate indicates the amount of chipping. As can be seen from FIG. 3 the lower the area ratio of the first dummy pattern 7 is, the more effectively chipping is prevented.

In this embodiment, the width of the scribe region 4 is from about 60 μm to about 150 μm, for example, and the width of the cutting region 5 located in the center of the scribe region 4 is equal to or slightly greater than that of the dicing blade 19, that is, from about 30 μm to about 70 μm. The non-cutting regions 6 located at both sides of the cutting region 5 has a width of from about 5 μm to about 40 μm.

For the first interlayer insulating films 11 and the second interlayer insulating films 12, insulating material, such as TEOS (Tetra-Ethyl-Ortho-Silicate) or FSG (Fluoro-Silicate-Glass), may be generally used. Also, for the interlayer insulating films 11 and 12, various types of low dielectric constant films, such as silicon oxycarbide (SiOC) films or porous films, may be used. The same material or different materials may be used for the first interlayer insulating films 11 and the second interlayer insulating films 12.

In FIG. 2B, for the sake of simplicity of the illustration, the first and second interlayer insulating films 11 and 12 each have the same film thickness. However, the first interlayer insulating films 11 and the second interlayer insulating films 12 may have the same film thickness or have different film thicknesses. For instance, low dielectric constant films having a thickness of from about 100 nm to about 300 nm may be used for the first and second interlayer insulating films 11 and 12 in lower layers (e.g., the first and second layers) in the multilayer structure (e.g., a seven-layer structure). Interlayer insulating films made of TEOS or the like and having a thickness of from about 300 nm to about 1500 nm may be used for the first and second interlayer insulating films 11 and 12 in upper layers (e.g., the sixth and seventh layers) in the multilayer structure. For the middle layers (e.g., the third to fifth layers), films made of TEOS or the like and having a thickness of from about 200 nm to about 500 nm may be used.

In the process step of forming the interconnects and the vias of the wiring patterns in the circuit regions 2 and in the scribe region 4 by damascene process or the like, the dummy interconnects and the dummy vias of the dummy patterns in the circuit regions 2 and in the scribe region 4 may be formed simultaneously with the interconnects and the vias, respectively. In this embodiment, the interconnects and the dummy interconnects and the vias and the dummy vias each may be made of conductive material, such as copper or an alloy of copper. Barrier films (not shown) for diffusion prevention, formed of thin films made of titanium nitride (TiN) or the like, may be provided for the interfaces between the interlayer insulating films 11 and 12.

The first and second protective films 16a and 16b formed on the upper surface of the uppermost first interlayer insulating film 11 are typically formed of a silicon nitride (SiN) film or the like having, in openings therein, pad portions (not shown) made of conductive material such as aluminum (Al). In this embodiment, the two-layer structure composed of the protective films 16a and 16b is formed, but a single layer structure or three or more layer structure may be adopted.

The buried films 18, buried in the spaces between the stacks of the first and second protective films 16a and 16b, may be made of conductive material such as Al. For example, the buried films 18 may be formed simultaneously with the pad portions in the process step for forming the pad portions. This structure reduces damage, such as chipping, occurring during the cutting in the dicing process.

Also, for the resin protective films 17 covering at least the upper faces of the circuit regions 2, polyimide or polybenzoxazole (PBO) resin is preferably used. Then, it becomes possible to protect the function elements formed in the circuit regions 2 from external stresses such as a filler contained in a plastic encapsulant that encapsulates the individually cut semiconductor devices.

In this embodiment, the seal rings 3 are formed doubly in the depth direction of the semiconductor substrate 1 by alternately stacking the linear wiring patterns and the line vias as described above. Since the seal rings 3 thus formed cut off the circuit regions 2 from the outside, the circuit regions 2 are protected from contamination with water, impurities, etc. In this embodiment, the seal rings 3 can be formed in the same process step and by using the same material as the wiring pattern formed in the circuit regions 2. The seal rings 3 do not necessarily have to be formed doubly, but may be formed singly or triply or more.

In the scribe region 4, alignment marks, and patterns or the like for process step control (not shown) are generally formed, and naturally, the first dummy pattern 7 and the second dummy pattern 8 are provided in regions where the alignment marks and the process-step-control patterns or the like are not formed. The first dummy pattern 7 and the second dummy pattern 8 may be provided only in part of regions in the scribe region 4 located in the direction perpendicular to the cutting direction or in part of the stacked interlayer insulating films 11 and 12. It is preferable that the alignment marks and the process-step-control patterns or the like be formed so as to be located within the cutting region 5 to the extent possible.

In the example described in this embodiment, the seven second interlayer insulating films 12 and the seven first interlayer insulating films 11 are alternately stacked on the substrate. Nevertheless, the numbers of the interlayer insulating films 11 and 12 are not limited to this embodiment, but the interlayer insulating films 11 and 12 may be stacked into various structures.

FIGS. 2A and 2B only schematically show the seal rings 3 and the dummy patterns 7 and 8. The dummy patterns 7 and 8 according to the invention are thus applicable to various structures other than that shown in FIGS. 2A and 2B.

Furthermore, the seal rings 3 surrounding the circuit regions 2 are not necessarily essential to the invention.

This is not limited to this embodiment, but the same is also true for all semiconductor devices according to the invention.

First Modified Example of the Embodiment

Figure 4:
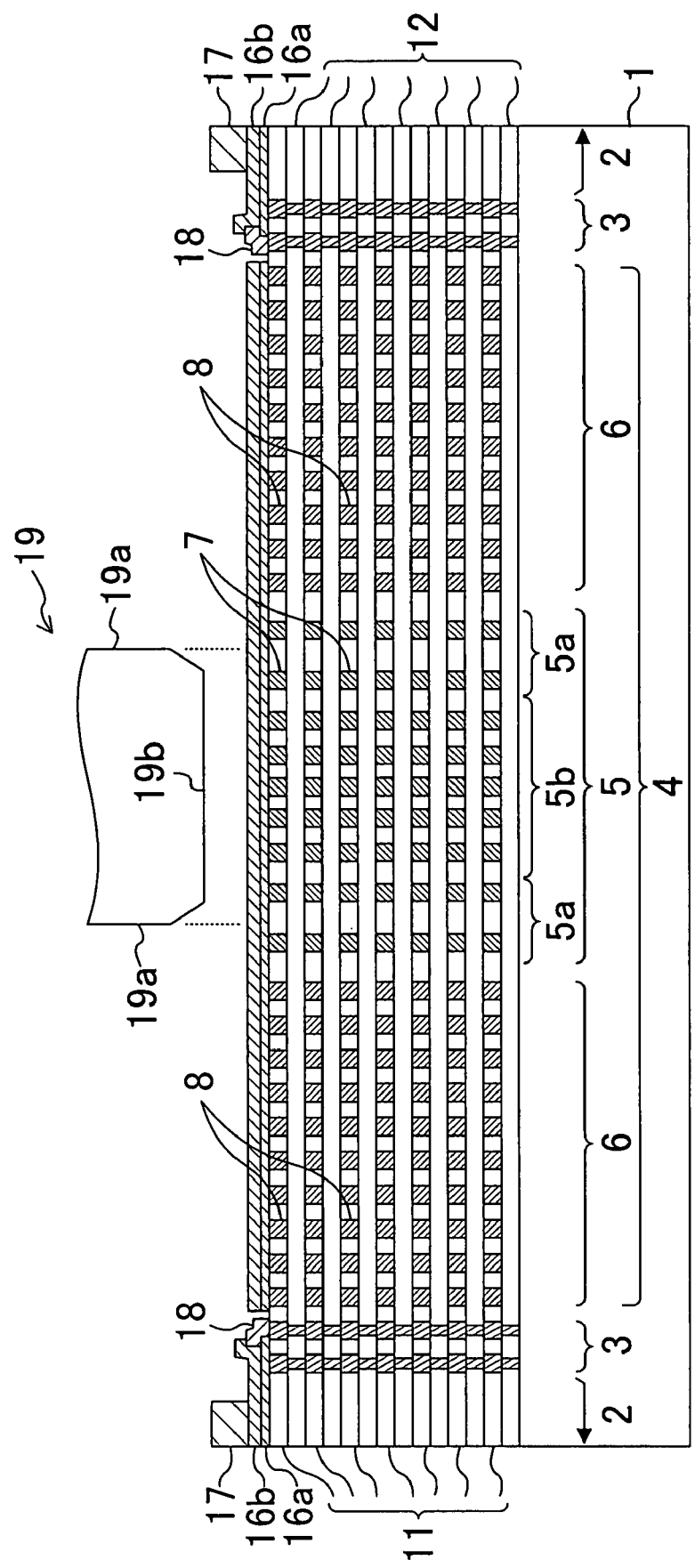
FIG. 4 is a cross-sectional view showing a scribe region in a semiconductor device according to a first modified example of the embodiment of the invention.

A first modified example of the embodiment of the invention will be described with reference to the accompanying drawings. FIG. 4 shows a cross-sectional structure of a region including the scribe region and the seal rings in a semiconductor device according to the first modified example. In FIG. 4, the same members as those shown in FIG. 2B are identified by the same reference numerals and the description thereof will be omitted herein. Likewise, in the other modified examples described below, the description of the same members will be omitted.

As shown in FIG. 4, in the semiconductor device according to the first modified example, the cutting region 5 includes a region that is put into contact with at least the lateral sides 19a and the edge side 19b of the dicing blade 19. And in first regions 5a in the cutting region 5, which are adjacent to the non-cutting regions 6, the ratio, per unit area, of the area occupied by the first dummy pattern 7 to the area of the first regions 5a is set lower as compared with a second region 5b, which is the region in the cutting region 5 other than the first regions 5a. That is, the first dummy pattern 7 formed in the first regions 5a that are brought into contact with the lateral sides 19a of the dicing blade 19 are provided more sparsely than the first dummy pattern 7 formed in the second region 5b. The ratio, per unit area, of the area occupied by the first dummy pattern 7 in the second region 5b in the cutting region 5 to the area of the second region 5b may be equal to or lower than the ratio, per unit area, of the area occupied by the second dummy pattern 8 to the area of the non-cutting regions 6.

By this structure, it is possible to reduce the amount of the conductive material of the first dummy pattern 7 in the first regions 5a in the cutting region 5 that are brought into contact with at least the lateral sides 19a of the dicing blade 19 in the dicing process, thereby suppressing clogging of the lateral sides 19a of the dicing blade 19. Thus, occurrence of substrate cracking due to clogging of the dicing blade 19 is prevented.

In addition, since the lateral sides 19a of the dicing blade 19 are hardly clogged, the dicing blade 19 is kept in good condition for a long time.

In the case described in this modified example by way of example, the first dummy pattern 7 in the first regions 5a in the cutting region 5 includes one pitch of the dummy pattern for an area width corresponding to at least two pitches in the second region 5b.

Second Modified Example of the Embodiment

Figure 5:
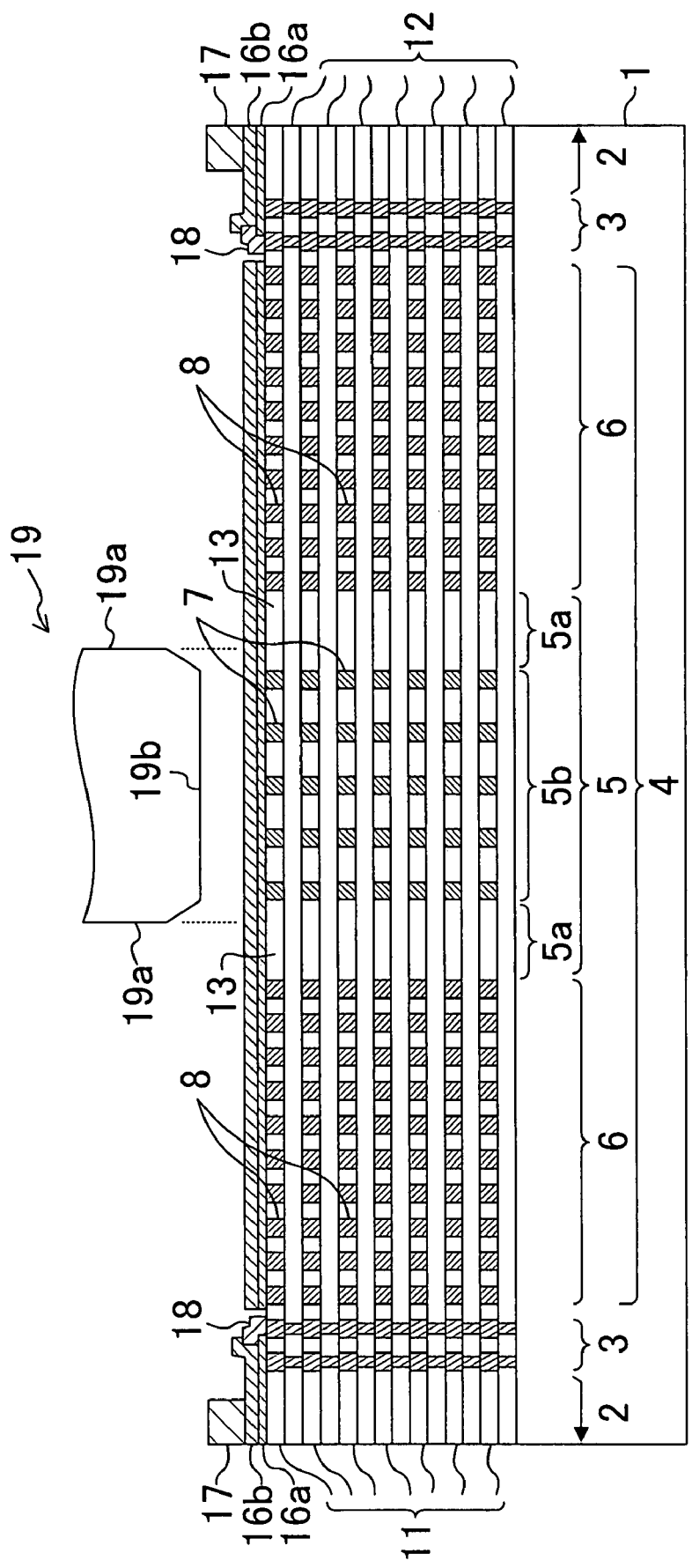
FIG. 5 is a cross-sectional view showing a scribe region in a semiconductor device according to a second modified example of the embodiment of the invention.

A second modified example of the embodiment of the invention will be described with reference to the accompanying drawings. FIG. 5 shows a cross-sectional structure of a region including the scribe region and the seal rings in a semiconductor device according to the second modified example.

As shown in FIG. 5, in the semiconductor device according to the second modified example, no first dummy pattern 7 is formed but first spaces 13 are provided in first regions 5a in the cutting region 5 in the scribe region 4, which are adjacent to the non-cutting regions 6 and which are brought into contact with at least the lateral sides 19a of the dicing blade 19. In a second region 5b, which is the region in the cutting region 5 other than the first regions 5a, the first dummy pattern 7 is formed, and the ratio, per unit area, of the area occupied by the first dummy pattern 7 to the area of the second region 5b may be equal to or lower than the ratio, per unit area, of the area occupied by the second dummy pattern 8 to the area of the non-cutting regions 6.

This structure at least prevents the conductive material of the first dummy pattern 7 from being put into contact with the lateral sides 19a of the dicing blade 19, when the multilayer structure of the interlayer insulating films 11 and 12 is cut with the dicing blade 19 in the dicing process. It is therefore possible to prevent clogging of the lateral sides 19a of the dicing blade 19 and hence the occurrence of substrate cracking caused by clogging of the dicing blade 19. Moreover, since the lateral sides 19a of the dicing blade 19 are not clogged, the life of the dicing blade 19 is increased.

In order to prevent clogging of the lateral sides 19a of the dicing blade 19 more reliably, it is desirable that the width of the first spaces 13 (the first regions 5a) be equal to or greater than the distance of the minimum pitch of the first dummy pattern 7.

Even in a case where the edge width of the dicing blade 19 is smaller than the width of the second region 5b having the first dummy pattern 7 formed therein, if the first spaces 13 are provided between the first and second dummy patterns 7 and 8 as in this modified example, the first spaces 13 function like buffer layers to produce the effect of reducing stress and hence the effect of preventing chipping in the direction toward the inside of the chip.

Third Modified Example of the Embodiment

Figure 6:
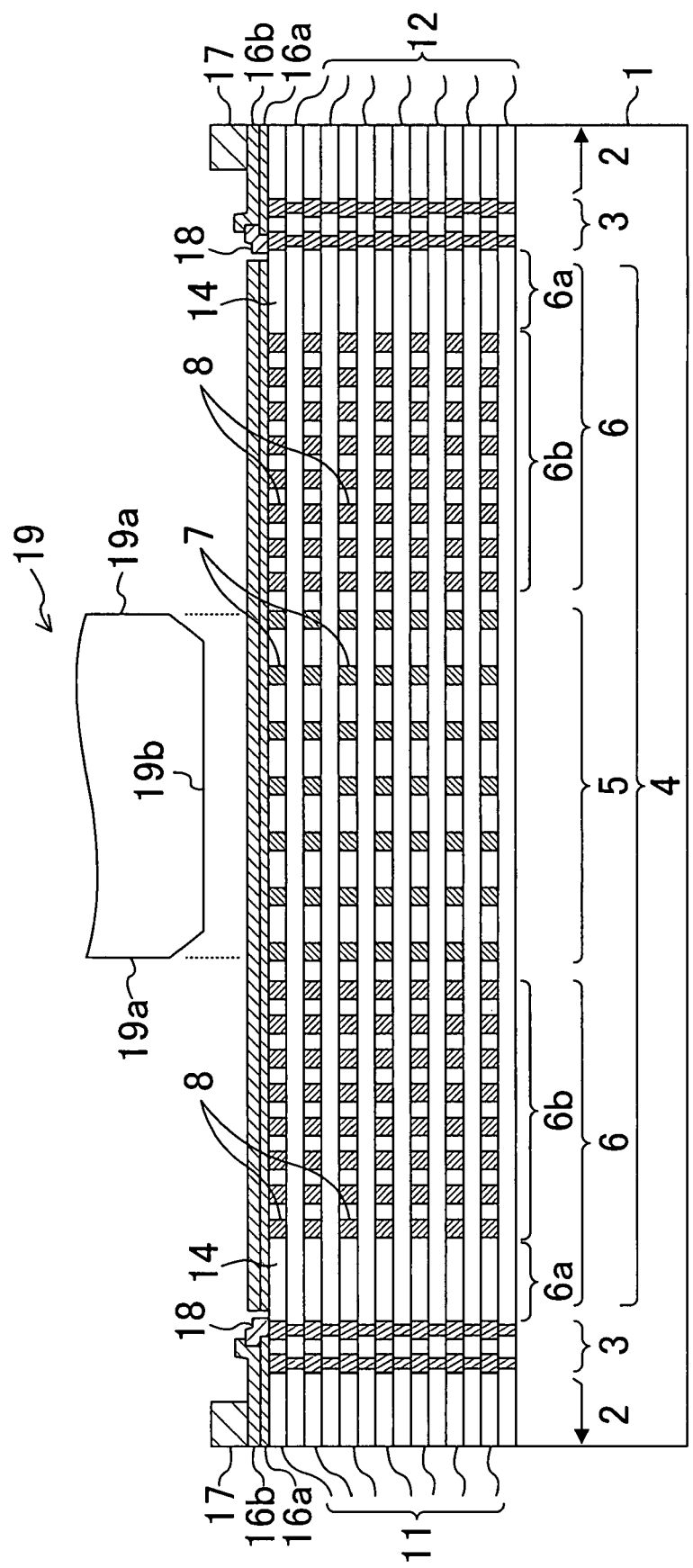
FIG. 6 is a cross-sectional view showing a scribe region in a semiconductor device according to a third modified example of the embodiment of the invention.

A third modified example of the embodiment of the invention will be described with reference to the accompanying drawings. FIG. 6 shows a cross-sectional structure of a region including the scribe region and the seal rings in a semiconductor device according to the third modified example.

As shown in FIG. 6, in the semiconductor device according to the third modified example, the non-cutting regions 6 in the scribe region 4 include third regions 6a adjacent to the circuit regions 2 including the seal rings 3, and fourth regions 6b adjacent to the cutting region 5. In the third regions 6a, no second dummy pattern 8 is formed, and the third regions 6a serve as second spaces 14 instead. The second dummy pattern 8 is formed only in the fourth regions 6b.

This structure prevents the non-cutting regions 6 in the scribe region 4, and the circuit regions 2 including the seal rings 3 adjacent to the non-cutting regions 6 from having the structural uniformity. In addition, the first interlayer insulating films 11 in the third regions 6a do not include the second dummy pattern 8 made of conductive material, and the second spaces 14 whose mechanical strength is structurally low are provided instead, whereby even if substrate cracking occurs during the dicing process, damage due to the cracking is allowed to escape into the second spaces 14 that break easily, thereby preventing the substrate cracking from reaching the circuit regions 2 beyond the seal rings 3.

The width of the second spaces 14 (the third regions 6a) is preferably equal to or greater than the distance of the minimum pitch of the second dummy pattern 8 or of the seal rings 3, so as to reserve the areas into which the substrate-cracking-caused damage escapes.

In the embodiment of the invention and in the modified examples thereof, the first dummy pattern 7 and the second dummy pattern 8 are described as a plurality of island-shaped (isolated) dummy interconnects formed in the first interlayer insulating films 11, but each dummy interconnect is not limited to the island shape, and a shape in which linear interconnects are combined with each other, or liner interconnects and island-shaped interconnects are combined with each other may also be adopted. Furthermore, the dummy interconnects may be provided with a plurality of dummy vias or line vias.

Figure 7:
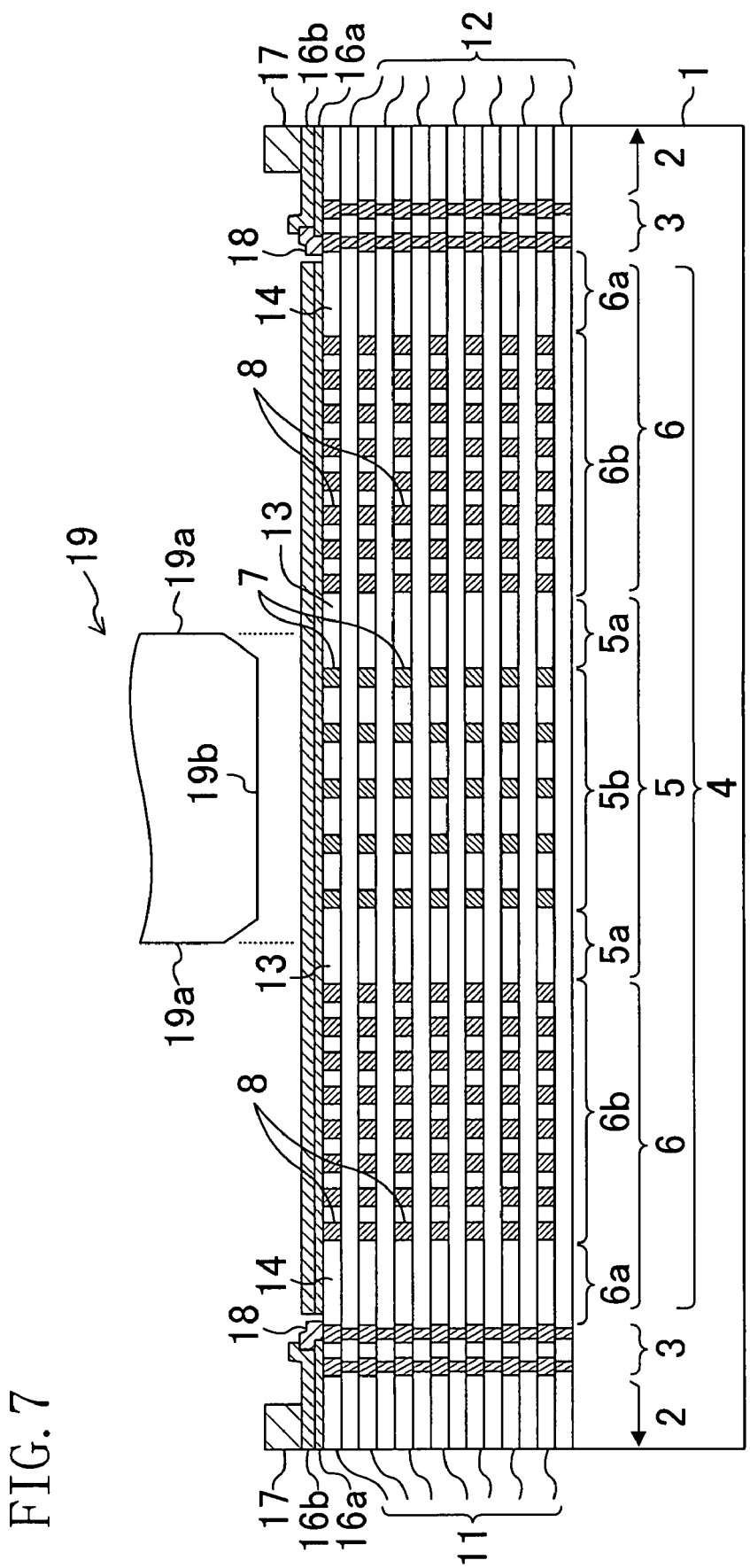
FIG. 7 is a cross-sectional view showing a scribe region in another semiconductor device according to the third modified example of the embodiment of the invention.

Also, as shown in FIG. 7, the semiconductor device according to the invention may be structured so that in the scribe region 4, the first spaces 13 are provided in the first regions 5a in the cutting region 5, and the second spaces 14 are provided in the third regions 6a in the non-cutting regions 6. In this case, the first dummy pattern 7 is provided only in the second region 5b in the cutting region 5, while the second dummy pattern 8 is provided only in the fourth regions 6b in the non-cutting regions 6. By this structure, two effects are achievable; the first spaces 13 produce the effect of preventing clogging of the dicing blade 19, while the second spaces 14 produce the effect of protecting the circuit regions 2 by allowing damage such as substrate cracking to escape.

The second spaces 14, provided in the third regions 6a in the non-cutting regions 6 in the scribe region 4 as in this modified example, function like buffer layers to produce the effect of reducing stress and hence the effect of preventing chipping in the direction toward the inside of the chip.

Fourth Modified Example of the Embodiment

Figure 8A:
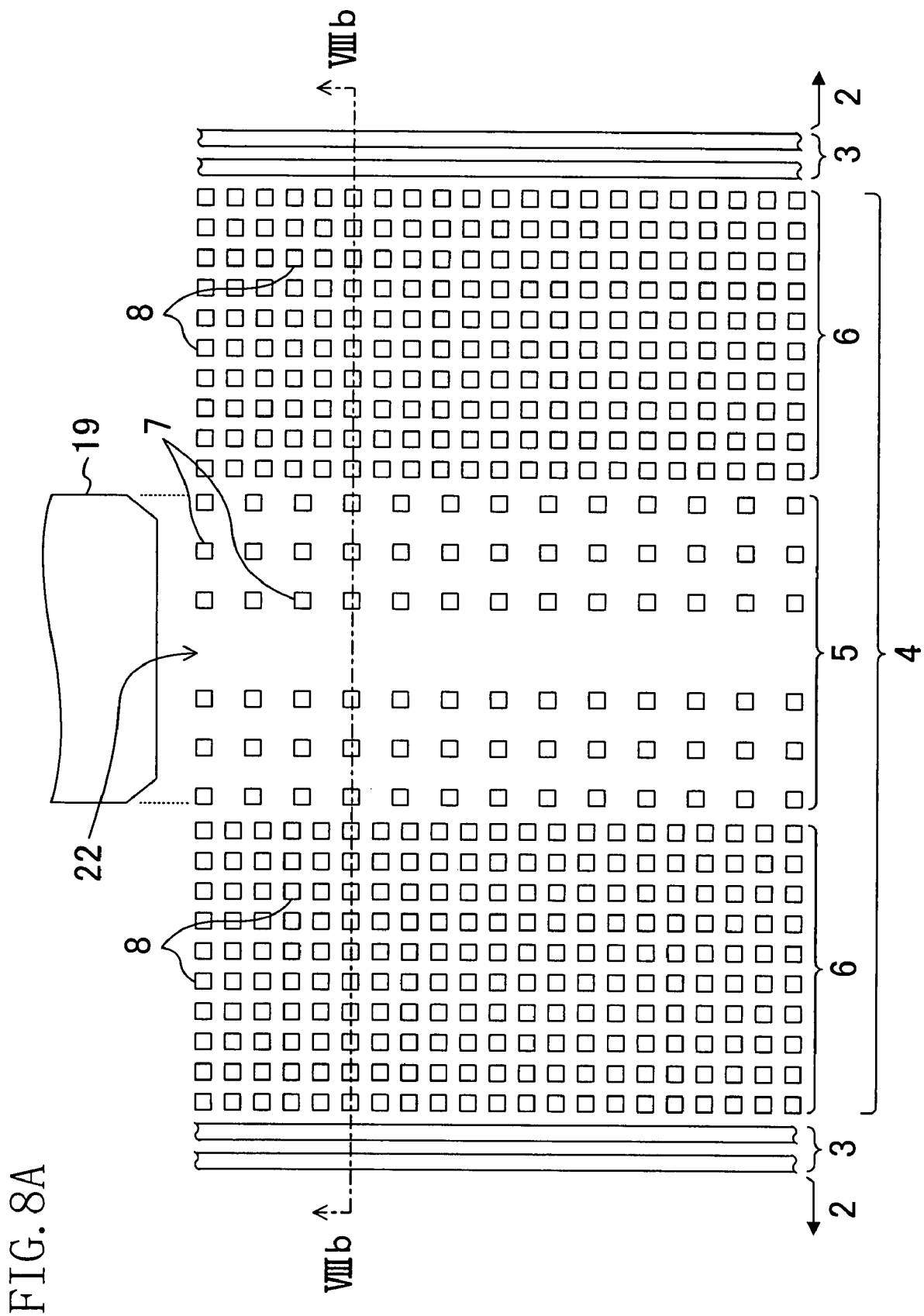
FIG. 8A is a plan view showing a scribe region in a semiconductor device according to a forth modified example of the embodiment of the invention.

A fourth modified example of the embodiment of the invention will be described with reference to the accompanying drawings. FIGS. 8A to 8F show the structures of regions, each including the scribe region and the seal rings, in semiconductor devices according to the fourth modified example. FIG. 8A is a plan view, and FIGS. 8B to 8F are cross-sectional views.

Figure 8B:
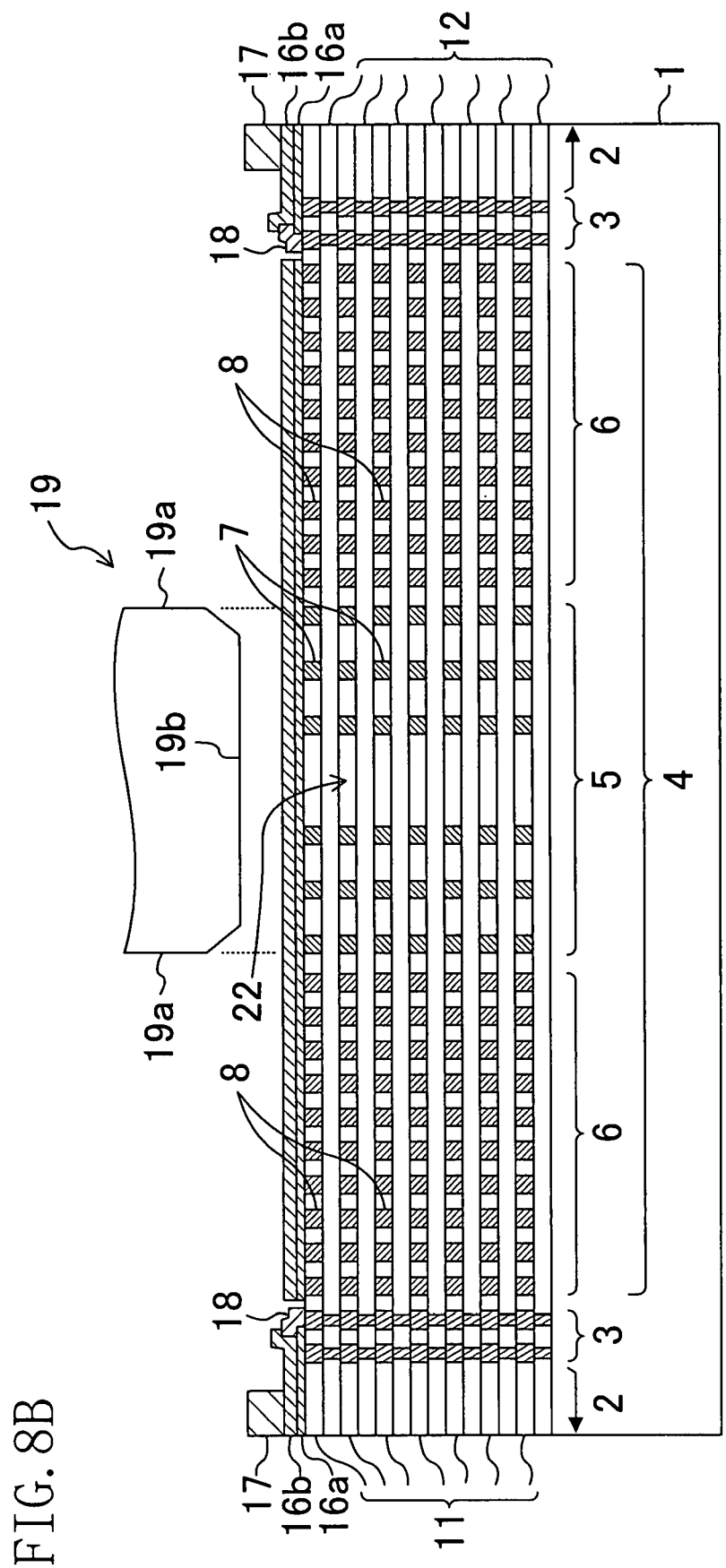
FIG. 8B is a cross-sectional view taken along the line VIIIb-VIIIb in FIG. 8A.

As shown in FIG. 8A and in FIG. 8B, which is a cross-sectional view of FIG. 8A, in a semiconductor device according to the fourth modified example, a third space 22, in which no first dummy pattern 7 is formed, is provided in the central part of the scribe region 4 in the direction in which the cutting region 5 is cut. That is, in the fourth modified example, the first dummy pattern 7 is formed in the part of the cutting region 5 other than the central part.

By this structure, it is possible to achieve the effect of preventing clogging of the dicing blade 19 and the effect of preventing chipping. To be more specific, since the third space 22 prevents clogging of the central part of the edge side 19b of the dicing blade 19, and also allows cracks occurring in the semiconductor substrate 1 to grow in the depth direction more easily, it is possible to prevent transverse stress and crack propagation in the semiconductor substrate 1.

Figure 8C:
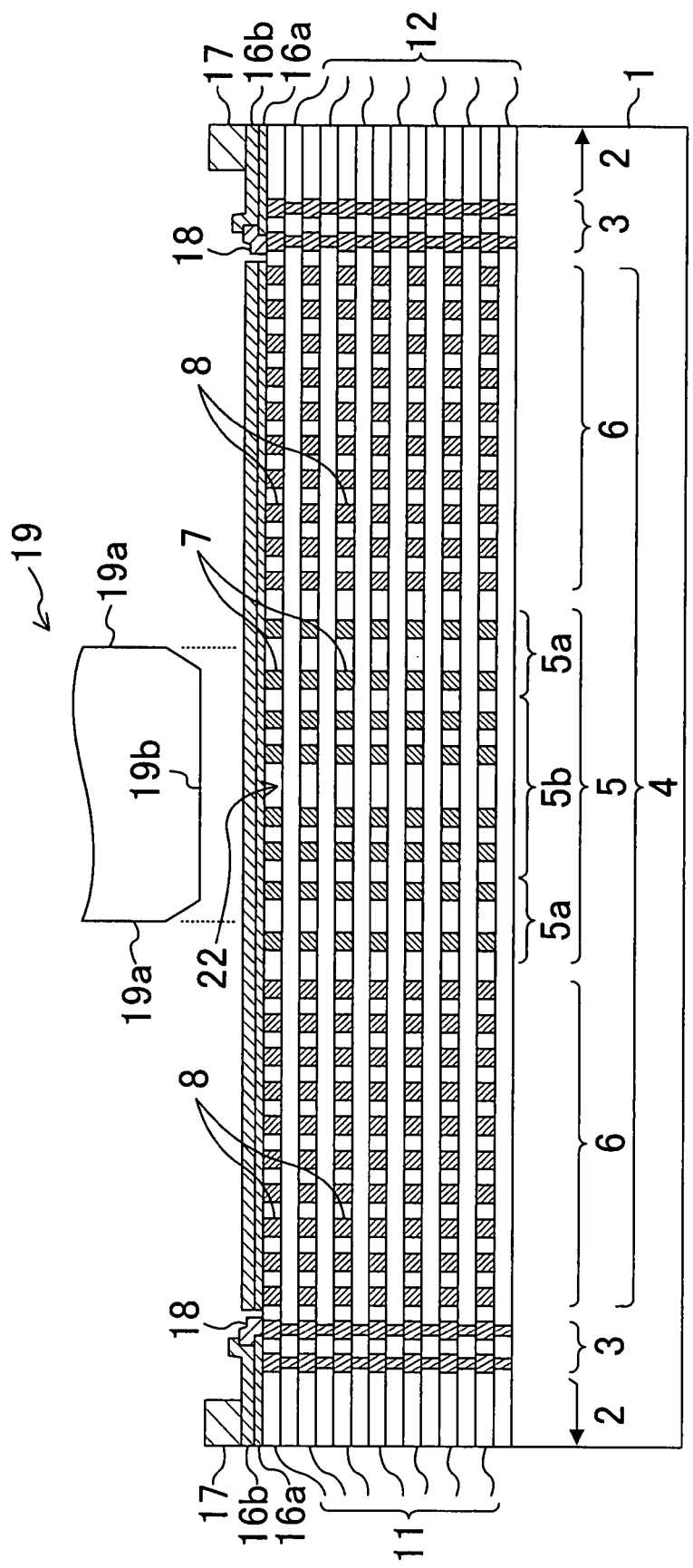
FIG. 8C is a cross-sectional view showing a scribe region in another semiconductor device according to the fourth modified example of the embodiment of the invention.

FIG. 8C shows a structure obtained by combining the structure of the fourth modified example, in which the third space 22 is provided in the cutting region 5, with the structure of the first modified example of the embodiment. That is, the structure shown in FIG. 8C is obtained by forming the third space 22 in the central part of the second region 5b in the cutting region 5 in the structure shown in FIG. 4, and is the same as the structure shown in FIG. 4 in the other respects.

Figure 8D:
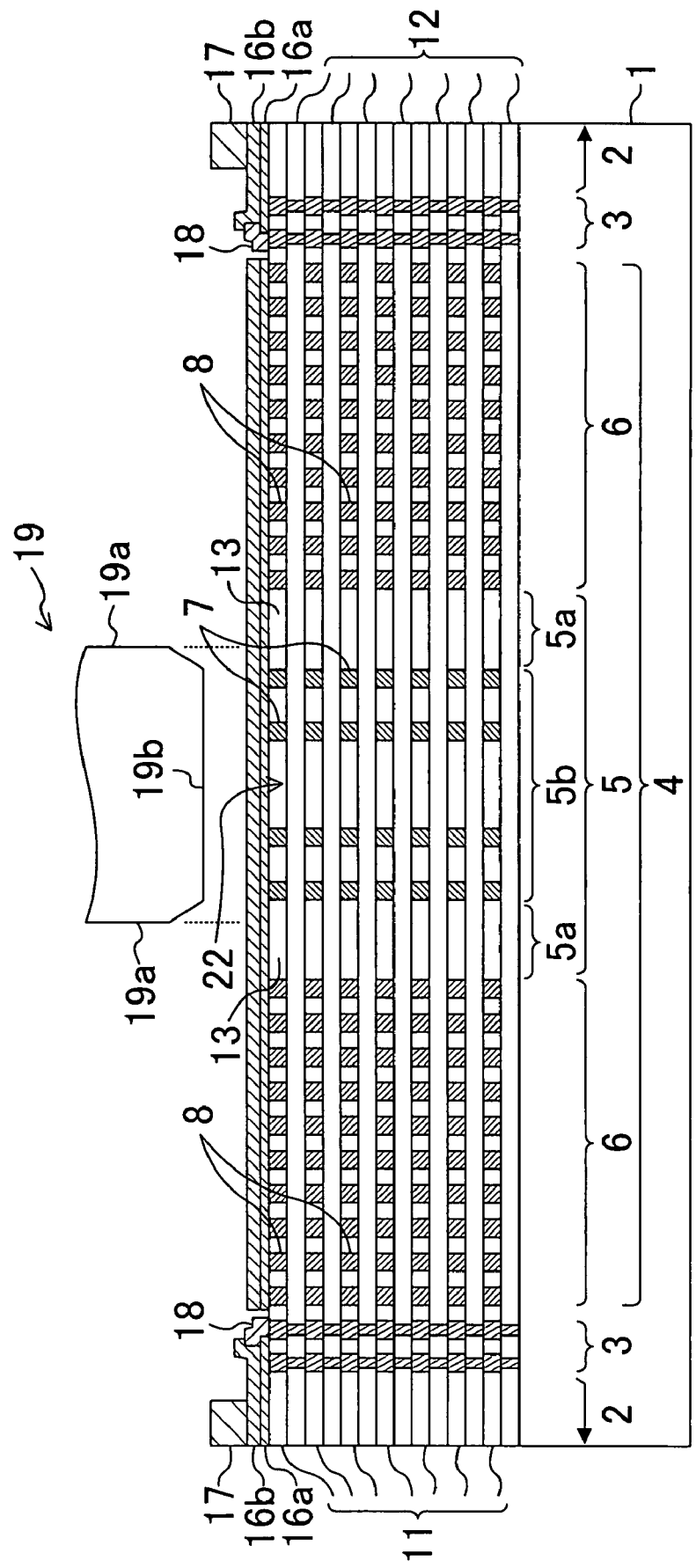
FIG. 8D is a cross-sectional view showing a scribe region in another semiconductor device according to the fourth modified example of the embodiment of the invention.

FIG. 8D shows a structure obtained by combining the structure of the fourth modified example with the structure of the second modified example of the embodiment. That is, the structure shown in FIG. 8D is obtained by forming the third space 22 in the central part of the second region 5b in the cutting region 5 in the structure shown in FIG. 5, and is the same as the structure shown in FIG. 5 in the other respects.

Figure 8E:
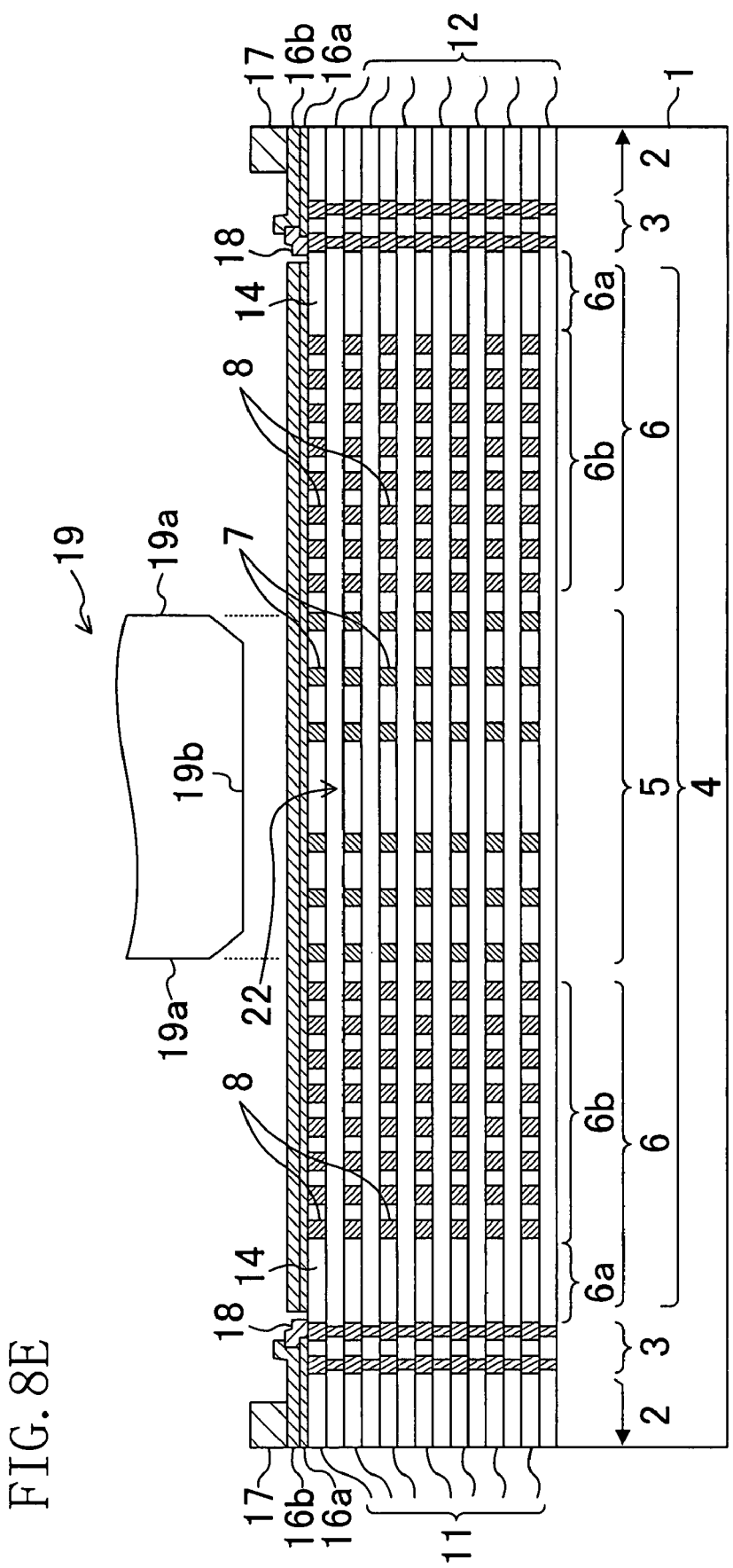
FIG. 8E is a cross-sectional view showing a scribe region in another semiconductor device according to the fourth modified example of the embodiment of the invention.

FIG. 8E shows a structure obtained by combining the structure of the fourth modified example with the structure of the third modified example of the embodiment. That is, the structure shown in FIG. 8E is obtained by forming the third space 22 in the central part of the cutting region 5 in the structure shown in FIG. 6, and is the same as the structure shown in FIG. 6 in the other respects.

Figure 8F:
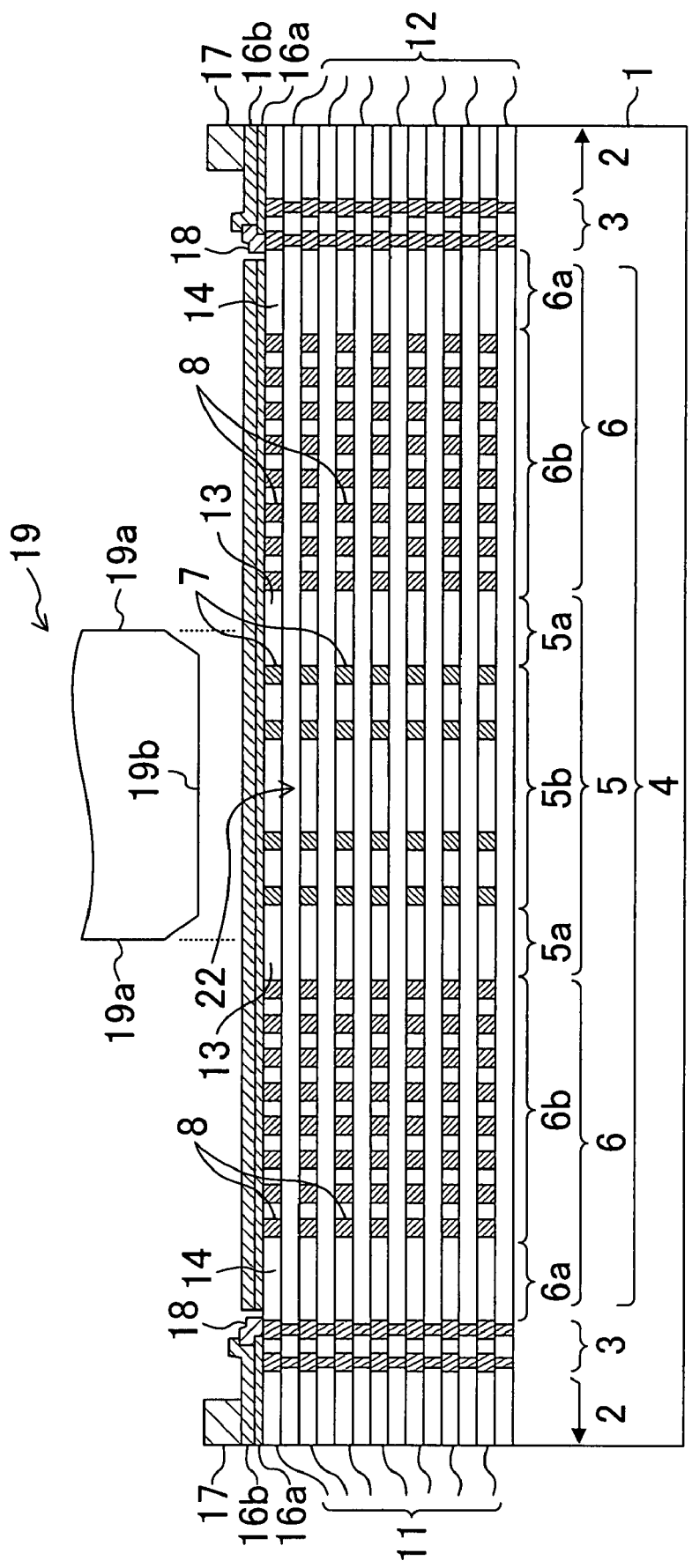
FIG. 8F is a cross-sectional view showing a scribe region in another semiconductor device according to the fourth modified example of the embodiment of the invention.

FIG. 8F shows a structure obtained by combining the structure of the fourth modified example with the other structure of the third modified example of the embodiment. That is, the structure shown in FIG. 8F is obtained by forming the third space 22 in the central part of the second region 5b in the cutting region 5 in the structure shown in FIG. 7, and is the same as the structure shown in FIG. 7 in the other respects.

The effects produced by the respective semiconductor devices of the modified examples are also achievable in this way.

Fifth Modified Example of the Embodiment

Figure 8G:
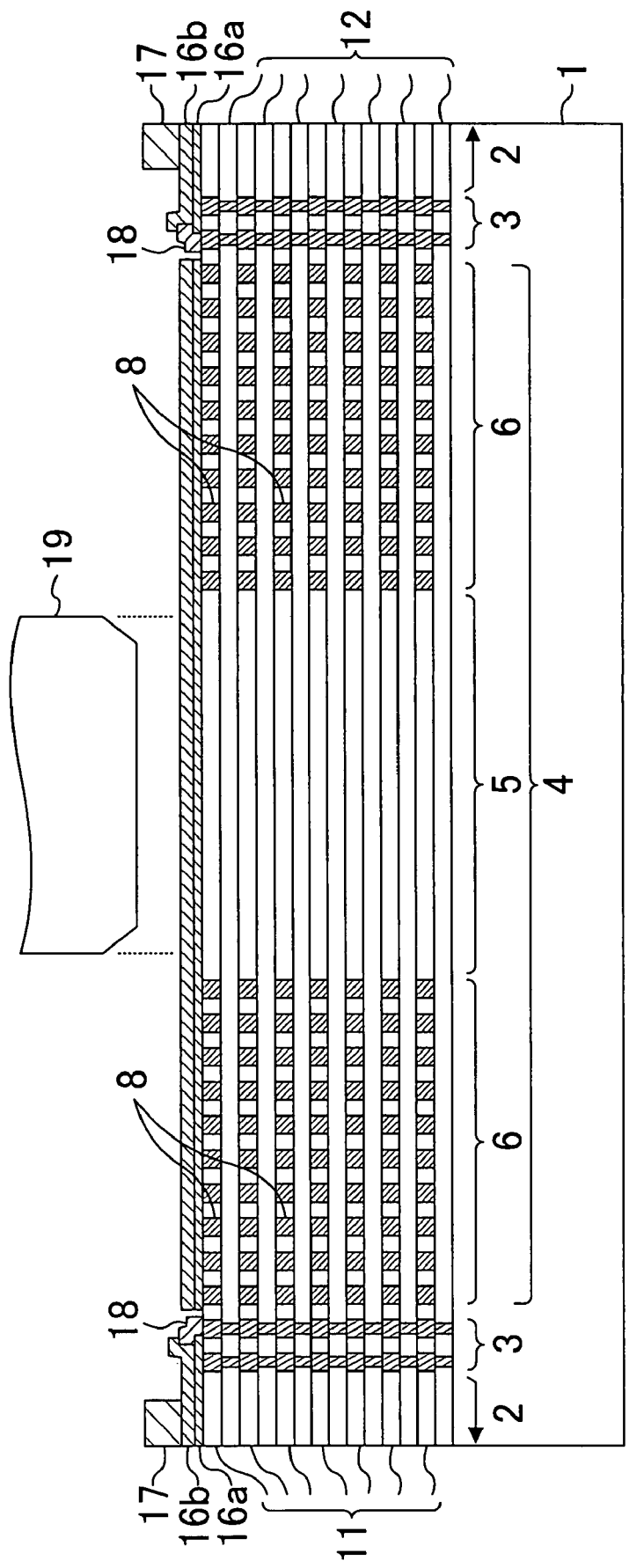
FIG. 8G is a cross-sectional view showing a scribe region in a semiconductor device according to a fifth modified example of the embodiment of the invention.
Figure 8H:
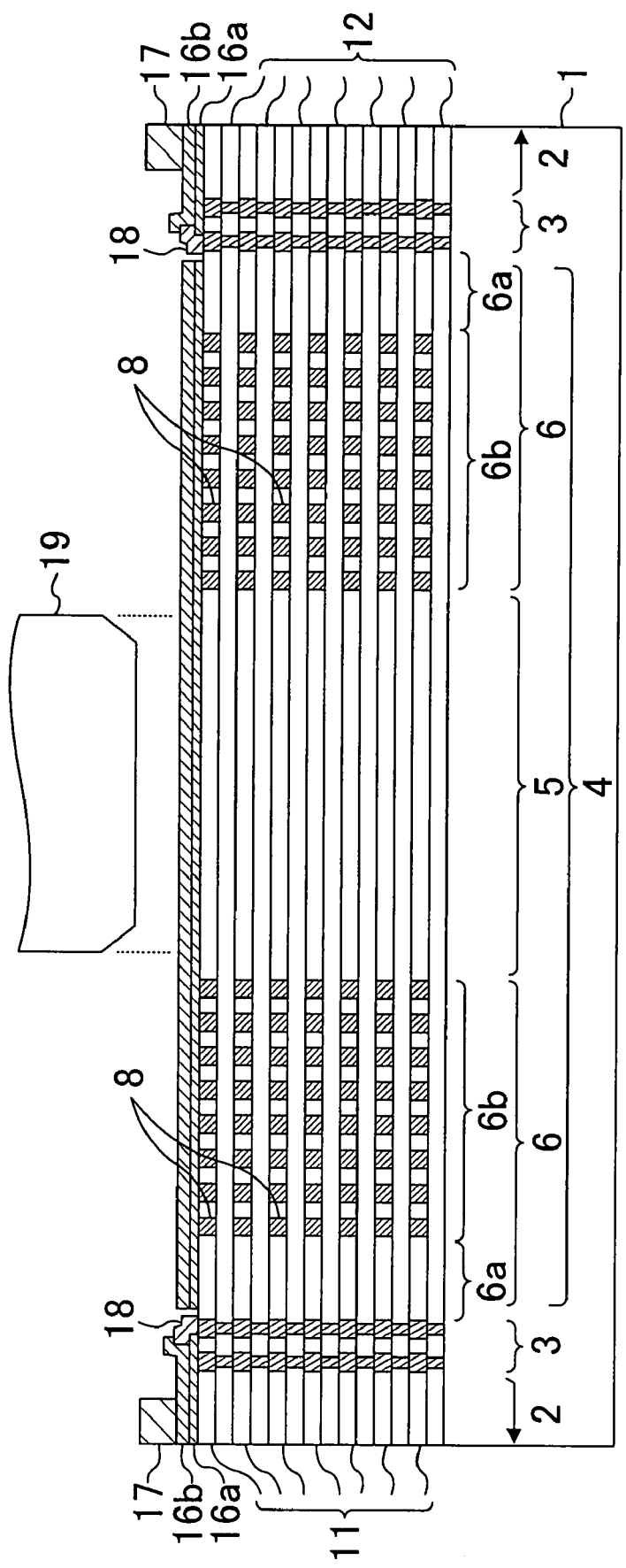
FIG. 8H is a cross-sectional view showing a scribe region in a semiconductor device according to the fifth modified example of the embodiment of the invention.

Also, as shown in FIGS. 8G and 8H, other structures may be adopted in which the first dummy pattern 7 made of conductive material is not formed in the cutting region 5 in the scribe region 4. These structures prevent clogging of the dicing blade 19 reliably. The structure shown in FIG. 8G is obtained by not forming the first dummy pattern 7 in the cutting region 5 in the structure shown in FIG. 2B, and is the same as the structure shown in FIG. 2B in the other respects. The structure shown in FIG. 8H is obtained by not forming the first dummy pattern 7 in the cutting region 5 in the structure shown in FIG. 6, and is the same as the structure shown in FIG. 6 in the other respects.

Sixth Modified Example of the Embodiment

Figure 9:
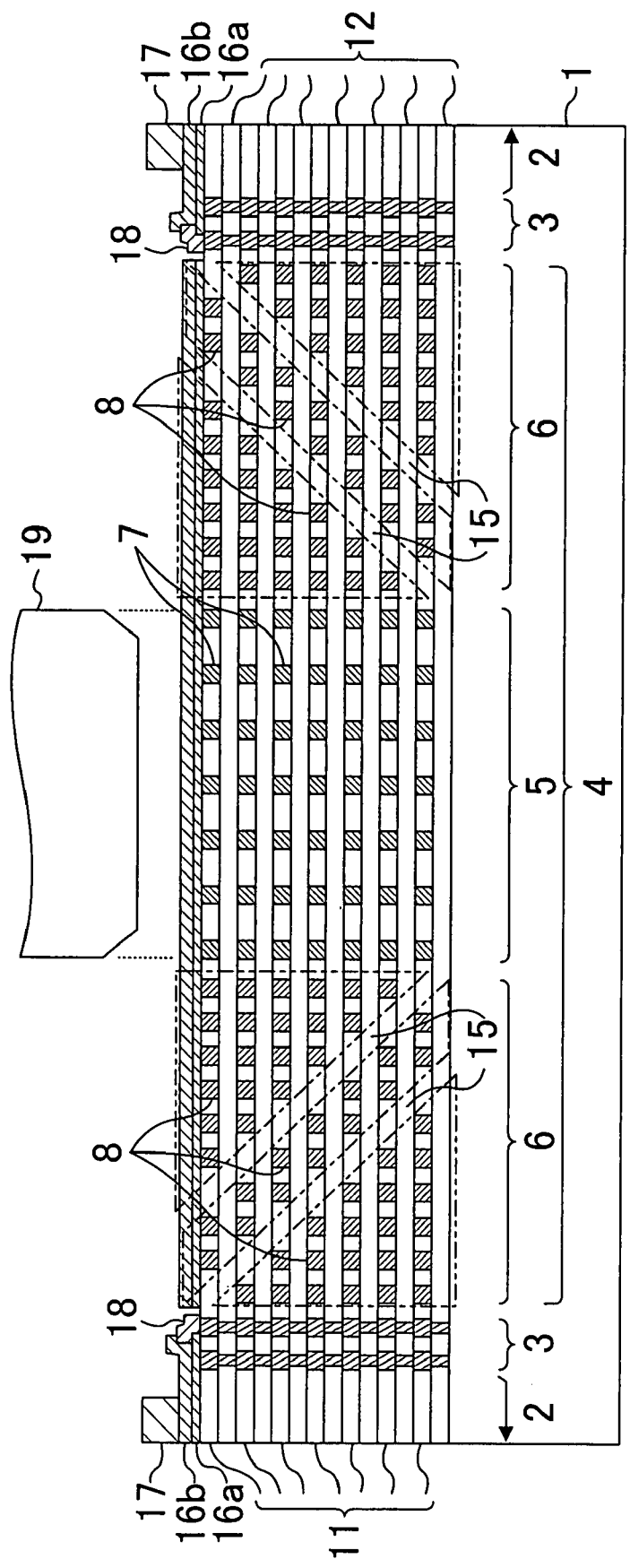
FIG. 9 is a cross-sectional view showing a scribe region in a semiconductor device according to a sixth modified example of the embodiment of the invention.
Figure 10A:
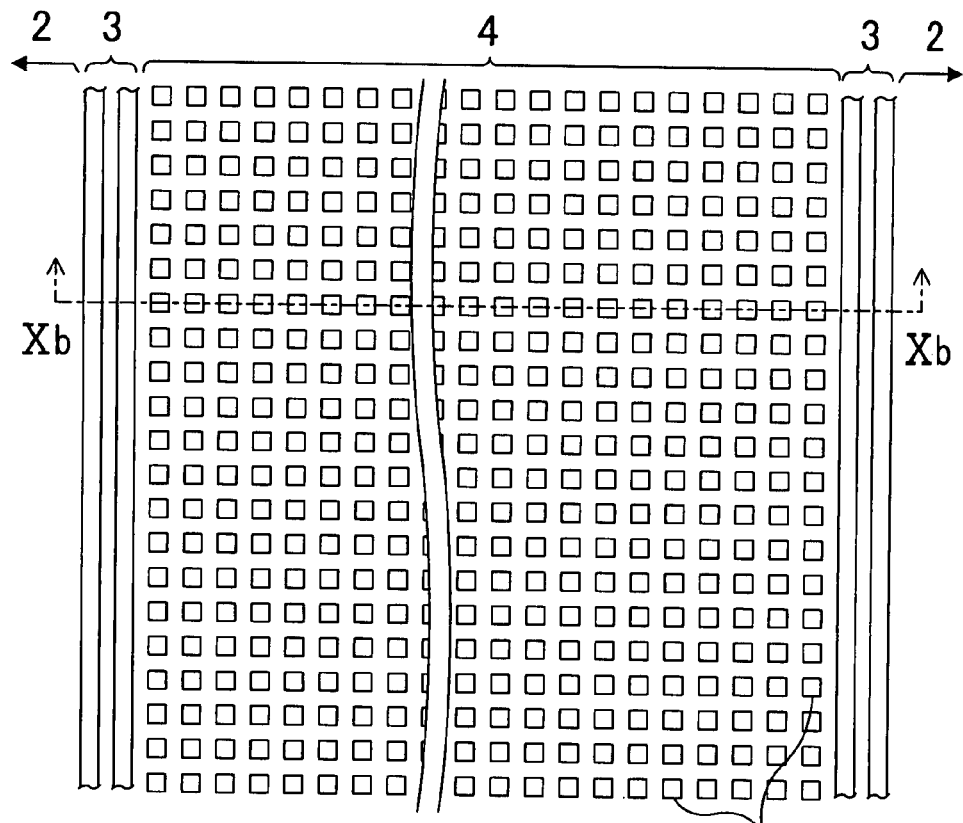
FIG. 10($a$) is a plan view showing a scribe region in conventional wafer-level semiconductor devices.
Figure 10B:
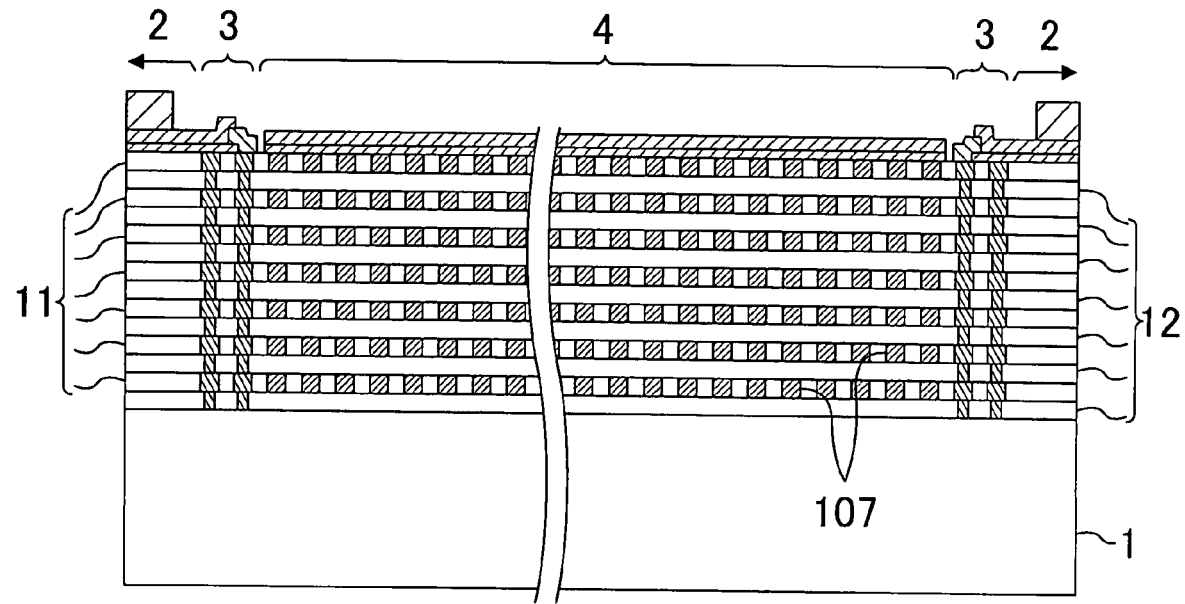

A sixth modified example of the embodiment of the invention will be described with reference to the accompanying drawings. FIG. 9 shows a cross-sectional structure of a region including the scribe region and the seal rings in a semiconductor device according to the sixth modified example. The structure shown in FIG. 9 is obtained by forming second spaces 15 in the non-cutting regions 6 in the structure shown in FIG. 2B, and is the same as the structure shown in FIG. 2B in the other respects.

As shown in FIG. 9, the semiconductor device according to the sixth modified example has the second spaces 15 in the non-cutting regions 6 in the scribe region 4, which are formed continuously in two rows in parallel with each other in a slanting direction with respect to the normal to the principal surface of the semiconductor substrate 1. Specifically, the second spaces 15 are each formed in such a manner that the lower part thereof is located close to the cutting region 5 and the upper part thereof is located close to the seal rings 3 adjacent to the non-cutting region 6.

As described above, the semiconductor device according to the sixth modified example includes no second dummy pattern 8 made of conductive material in the non-cutting regions 6 in the scribe region 4, and the second spaces 15 whose structural strength is low are provided instead. Thus, in the dicing process, the second spaces 15 in the non-cutting regions 6 are easily broken. This allows the second spaces 15 to absorb stress that would otherwise cause film peeling in the interlayer insulating films 11 and 12 and substrate cracking. In particular, the multiple second spaces 15, formed continuously in the interlayer insulating films 11 and 12 from the lower part close to the cutting region 5 to the upper part close to the seal rings 3, make cracks less likely to grow toward the semiconductor substrate 1, thereby enabling the substrate cracks to escape more effectively. That is, when the dicing is performed, stress which starts from the cutting region 5 and which would cause film peeling and substrate cracking is permitted to effectively escape toward the upper layers along the second spaces 15, which are non-reinforced regions formed slantingly in the non-cutting regions 6 from the lower part close to the cutting region 5 to the upper part close to the seal rings 3.

It should be noted that the second spaces 15 are not limited to the two rows, but may be formed in a single row or in three or more rows.

In the sixth modified example, the second spaces 15 are each formed in a slanting direction so that the lower part thereof is located close to the cutting region 5 and the upper part thereof is located close to the seal rings 3. However, the second spaces 15 may be formed in the reverse direction. Specifically, the second spaces 15 may be formed so that the lower part thereof is located close to the seal rings 3 and the upper part thereof is located close to the cutting region 5 to the extent that substrate cracking does not reach the circuit regions 2.

While the embodiment of the invention and the modified examples of thereof have been described with reference the accompanying drawings, the embodiment and the modified examples are only illustrative of the invention, and other embodiments in which the embodiment and the modified examples are combined are also within the scope of the invention. And it will be understood that various structures other than those herein shown may be adopted without departing from the spirit of the invention.

As described above, in the semiconductor devices according to the invention, dishing occurring in CMP process is prevented, and cracking in the semiconductor substrate is suppressed by reducing clogging of the dicing blade when the semiconductor substrate is diced. The inventive semiconductor devices are thus applicable to semiconductor devices having a multilevel interconnection structure, and the like.

What is claimed is:

1. A semiconductor device, comprising:
   a circuit region having a function element formed on a semiconductor substrate;
   a scribe region located between the circuit region and another circuit region formed spaced from the circuit region, the scribe region including a cutting region cut by a dicing blade and non-cutting regions provided at both sides of the cutting region and not cut by the dicing blade;
   a first interlayer insulating film formed in the scribe region on the semiconductor substrate;
   a first dummy pattern made of conductive material and formed in the first interlayer insulating film in the cutting region; and
   a second dummy pattern made of conductive material and formed in the first interlayer insulating film in each of the non-cutting regions,
   wherein a ratio, per unit area, of the area of the first dummy pattern to the area of the cutting region is lower than the ratio, per unit area, of the area of the second dummy pattern to the area of the non-cutting regions.

2. The device of claim 1, wherein the cutting region has a width equal to or greater than the edge width of the dicing blade used to cut the scribe region.

3. The device of claim 1, further comprising a seal ring made of conductive material and formed on the semiconductor substrate so as to surround the periphery of the circuit region.

4. The device of claim 1, wherein the scribe region is formed surrounding the circuit region and serves as a region which is cut when the circuit region is cut from the semiconductor substrate.

5. The device of claim 1, wherein the pitch of the first dummy pattern is greater than that of the second dummy pattern.

6. The device of claim 1, wherein the size of the first dummy pattern is smaller than that of the second dummy pattern.

7. The device of claim 1, wherein an average ratio, per unit area, of the area of the first dummy pattern to the area of the cutting region is equal to or higher than 10% and lower than 25%; and
   an average ratio, per unit area, of the area of the second dummy pattern to the area of the non-cutting regions is equal to or higher than 25% and equal to or lower than 90%.

8. The device of claim 1, wherein regions in the cutting region which are brought into contact with the lateral sides of the dicing blade are spaces in which the first dummy pattern is not formed.

9. The device of claim 8, wherein the spaces have a width equal to or greater than the distance of a minimum pitch of the first dummy pattern.

10. The device of claim 1, wherein the cutting region includes a region which is brought into contact with at least the lateral sides of the dicing blade, and has first regions, which are adjacent to the non-cutting regions, and a second region, which is a region in the cutting region other than the first regions; and
    the ratio, per unit area, of the area of part of the first dummy pattern located in the first regions to the area of the first regions is lower than the ratio, per unit area, of the area of part of the first dummy pattern located in the second region to the area of the second region.

11. The device of claim 1, wherein the cutting region includes a region which is brought into contact with at least the lateral sides of the dicing blade, and has first regions, which are adjacent to the non-cutting regions, and a second region, which is a region in the cutting region other than the first regions; and
    the first dummy pattern is not formed in the first regions, and the first dummy pattern is formed only in the second region.

12. The device of claim 10, wherein the second region in the cutting region has a width smaller than the edge width of the dicing blade and is located inwardly of the lateral sides of the dicing blade.

13. The device of claim 1, wherein the non-cutting regions include first regions adjacent to the circuit region, and second regions adjacent to the cutting region; and the first regions are second spaces in which the second dummy pattern is not formed, and the second dummy pattern is formed only in the second regions.

14. The device of claim 13, wherein the spaces have a width equal to or greater than the distance of a minimum pitch of the second dummy pattern.

15. The device of claim 1, wherein a space in which the first dummy pattern is not formed is provided in a central part of the cutting region in a direction in which the cutting region is cut.

16. The device of claim 1, wherein the first interlayer insulating film is also formed in the circuit region on the semiconductor substrate; and in the first interlayer insulating film, an interconnect, which is electrically connected with the function element is formed.

17. The device of claim 16, further comprising a second interlayer insulating film formed on the upper or lower side of the first interlayer insulating film; and a via formed in the second interlayer insulating film and electrically connected with the interconnect.

18. The device of claim 1, wherein the cutting region has a width from about 30 μm to about 70 μm.

19. The device of claim 1, wherein the non-cutting regions have a width of from about 5 μm to about 40 μm.

* * * * *